US012628491B2

(12) United States Patent
Gehan et al.

(10) Patent No.: US 12,628,491 B2
(45) Date of Patent: May 12, 2026

(54) ORGANIC-INORGANIC ADHESION LAYER AND ITS USE IN PEROVSKITE SOLAR CELLS AND MODULES

(71) Applicant: Tandem PV, San Jose, CA (US)

(72) Inventors: Timothy Sean Gehan, Mountain View, CA (US); Colin David Bailie, Morgan Hill, CA (US)

(73) Assignee: Tandem PV, San Jose, CA (US)

( * ) Notice: Subject to any disclaimer, the term of this patent is extended or adjusted under 35 U.S.C. 154(b) by 22 days.

(21) Appl. No.: 18/379,146

(22) Filed: Oct. 11, 2023

(65) Prior Publication Data

US 2024/0121970 A1 Apr. 11, 2024

Related U.S. Application Data

(60) Provisional application No. 63/379,094, filed on Oct. 11, 2022.

(51) Int. Cl.
*H10K 30/80* (2023.01)
*H10K 30/85* (2023.01)
(Continued)

(52) U.S. Cl.
CPC ............. *H10K 30/80* (2023.02); *H10K 30/85* (2023.02); *H10K 30/86* (2023.02); *H10K 30/40* (2023.02);
(Continued)

(58) Field of Classification Search
CPC ........ H10K 30/80; H10K 30/85; H10K 30/86; H10K 30/40; H10K 85/211;
(Continued)

(56) References Cited

U.S. PATENT DOCUMENTS

2014/0014931 A1* 1/2014 Riegel .................. H10K 85/346
                                                                438/46
2016/0049585 A1* 2/2016 Lin ........................ H10K 30/30
                                                                438/82
(Continued)

FOREIGN PATENT DOCUMENTS

CN      108 461 633 A     8/2018
WO      2019/077358 A1    4/2019

OTHER PUBLICATIONS

Palmstrom ("Enabling Flexible All-Perovskite Tandem Solar Cells") Joule 3, 2193-2204, Sep. 18, 2019 (Year: 2019).*
(Continued)

*Primary Examiner* — Angelo Trivisonno
(74) *Attorney, Agent, or Firm* — Patterson + Sheridan, LLP

(57) ABSTRACT

Embodiments of the disclosure include an electronic device comprising a first electrode, a second electrode, a first layer disposed between the first electrode and the second electrode, the first layer comprising a metal-halide perovskite material, and an adhesive layer disposed between the first layer and the second electrode, wherein the adhesive layer comprises an organic material. Embodiments of the disclosure generally relate to photovoltaic module products, such as photovoltaic cells, photovoltaic devices and photovoltaic modules that include an absorber layer that comprise a perovskite material. Embodiments of the disclosure include an improved perovskite solar cell architecture that includes one or more buffer layers disposed within the multilayer stack of thin films used to form a solar cell that can exhibit high solar cell performance, and provide stronger adhesion between adjacent layers and/or cohesion within a layer within the multilayer stack used to form the solar cell device.

29 Claims, 11 Drawing Sheets

(51) Int. Cl.
  *H10K 30/86* (2023.01)
  *H10K 30/40* (2023.01)
  *H10K 85/20* (2023.01)
  *H10K 85/60* (2023.01)

(52) U.S. Cl.
  CPC ........ *H10K 85/211* (2023.02); *H10K 85/6572* (2023.02)

(58) Field of Classification Search
  CPC ............. H10K 85/6572; H10K 85/615; H10K 85/621; H10K 85/622; H10K 85/654; H10K 30/20; H10K 85/50
  See application file for complete search history.

(56) References Cited

U.S. PATENT DOCUMENTS

| | | |
|---|---|---|
| 2016/0218307 A1 | 7/2016 | Huang et al. |
| 2021/0159419 A1 | 5/2021 | Irwin et al. |
| 2022/0310929 A1 | 9/2022 | Snaith et al. |

OTHER PUBLICATIONS

Wu Fei et al: "Replacement of Biphenyl by Bipyridine Enabling Powerful Hole Transport Materials for Efficient Perovskite Solar Cells", Chemsuschem, vol. 10, No. 19, Aug. 2, 2017 (Aug. 2, 2017), pp. 3833-3838.

International Search Report dated Jan. 25, 2024 for PCT/US2023/076628.

Seonju Jeong et al. "An Interlocking Fibrillar Polymer Layer for Mechanical Stability of Perovskite Solar Cells", Advanced Materials Interfaces. 2020.

Jin Hyuck Heo et al. "Highly flexible, high-performance perovskite solar cells with adhesion promoted AuCl3-doped graphene electrodes", Journal of Materials Chemistry A. Chem. A. 2017.

Jie Dou et al. "Improved interfacial adhesion for stable flexible inverted perovskite solar cells", Journal of Energy Chemistry. 76 (2023).

Tian Tian et al. "Interfacial Linkage and Carbon Encapsulation Enable Full Solution-Printed Perovskite Photovoltaics with Prolonged Lifespan", Angew. Chem. Int. Ed. 2021, 60, 23735-23742.

Roy et al. "Perylene Monoimide as a Versatile Fluoroprobe: The Past, Present, and Future," Organic Materials, 2021, 3, 417-454.

Shen et al. "Bis-peri-dinaphtho-rylenes: Facile Synthesis via Radical-Mediated Coupling Reactions and their Distinctive Electronic Structures," Angewandte Chemie, Nov. 6, 2023, vol. 62, Issue 45.

* cited by examiner

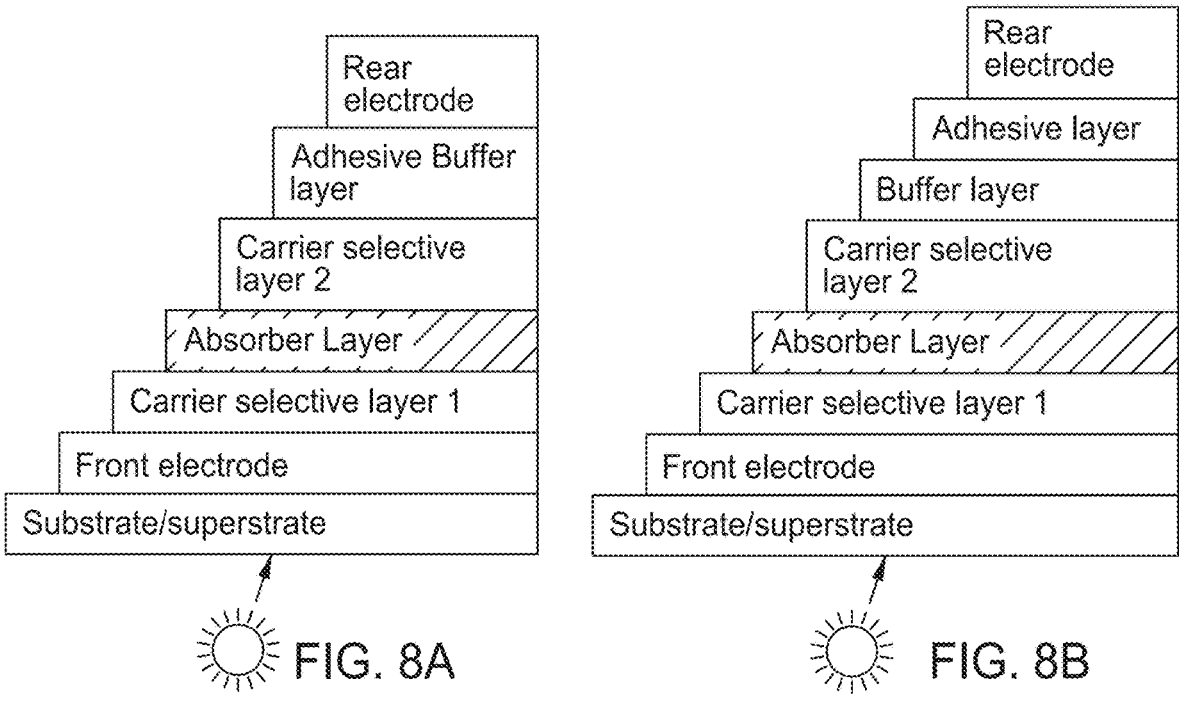
FIG. 8A
FIG. 8B
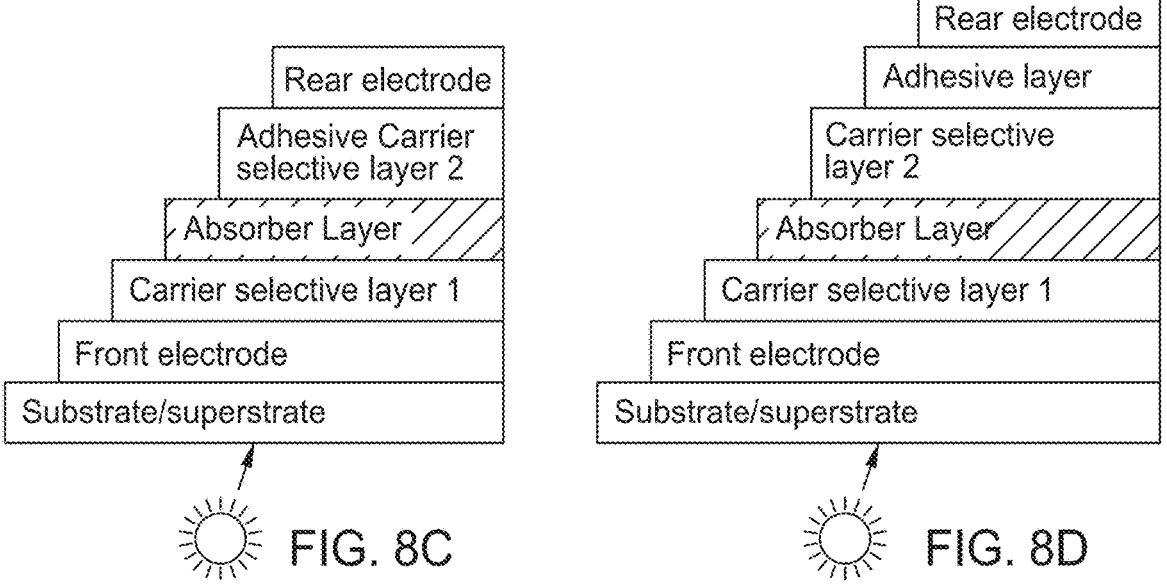
FIG. 8C
FIG. 8D 2,2'-Bipyridine-6,6'-diol 4,4'-Bis(hydroxymethyl)-2,2'-Bipyridine Dimethyl-2,2'-Bipyridine-5,5'-dicarboxylate Dimethyl-2,2'-Bipyridine-4,4'-dicarboxylate 2,2'-Bipyridine-5,5'-dicarboxylic Acid 2,2'-Bipyridine-3,3'-dicarboxylic Acid 4,4'-Dimethoxy-2,2'-bipyridyl 4,7'-Dihydroxy-1,10-phenanthroline

Figure 13B:
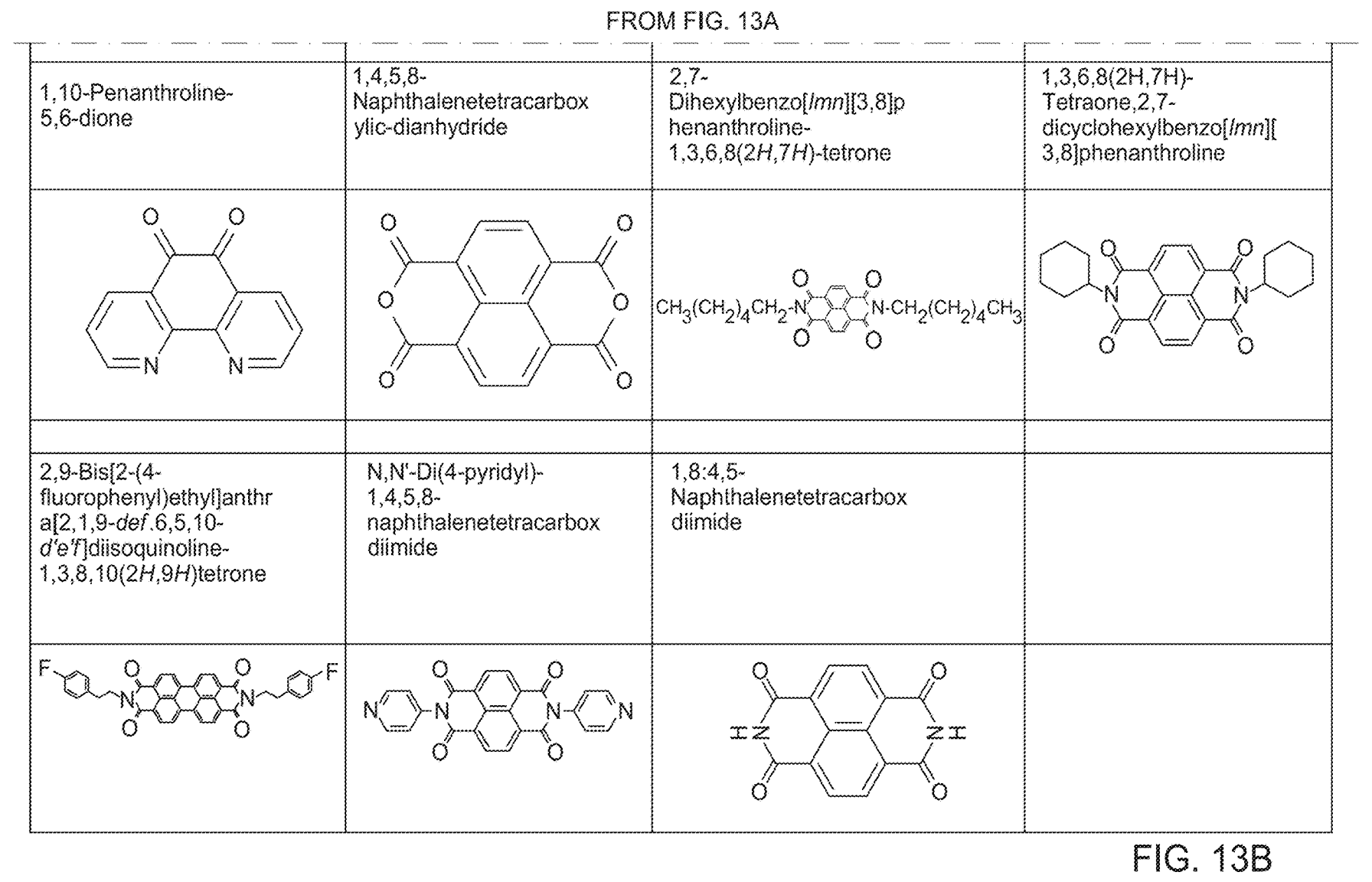

FROM FIG. 13A

| 1,10-Penanthroline-5,6-dione | 1,4,5,8-Naphthalenetetracarboxylic-dianhydride | 2,7-Dihexylbenzo[lmn][3,8]phenanthroline-1,3,6,8(2H,7H)-tetrone | 1,3,6,8(2H,7H)-Tetraone,2,7-dicyclohexylbenzo[lmn][3,8]phenanthroline |
|---|---|---|---|

| 2,9-Bis[2-(4-fluorophenyl)ethyl]anthra[2,1,9-def:6,5,10-d'e'f']diisoquinoline-1,3,8,10(2H,9H)tetrone | N,N'-Di(4-pyridyl)-1,4,5,8-naphthalenetetracarbox diimide | 1,8:4,5-Naphthalenetetracarbox diimide | |
|---|---|---|---|

Figure 14:
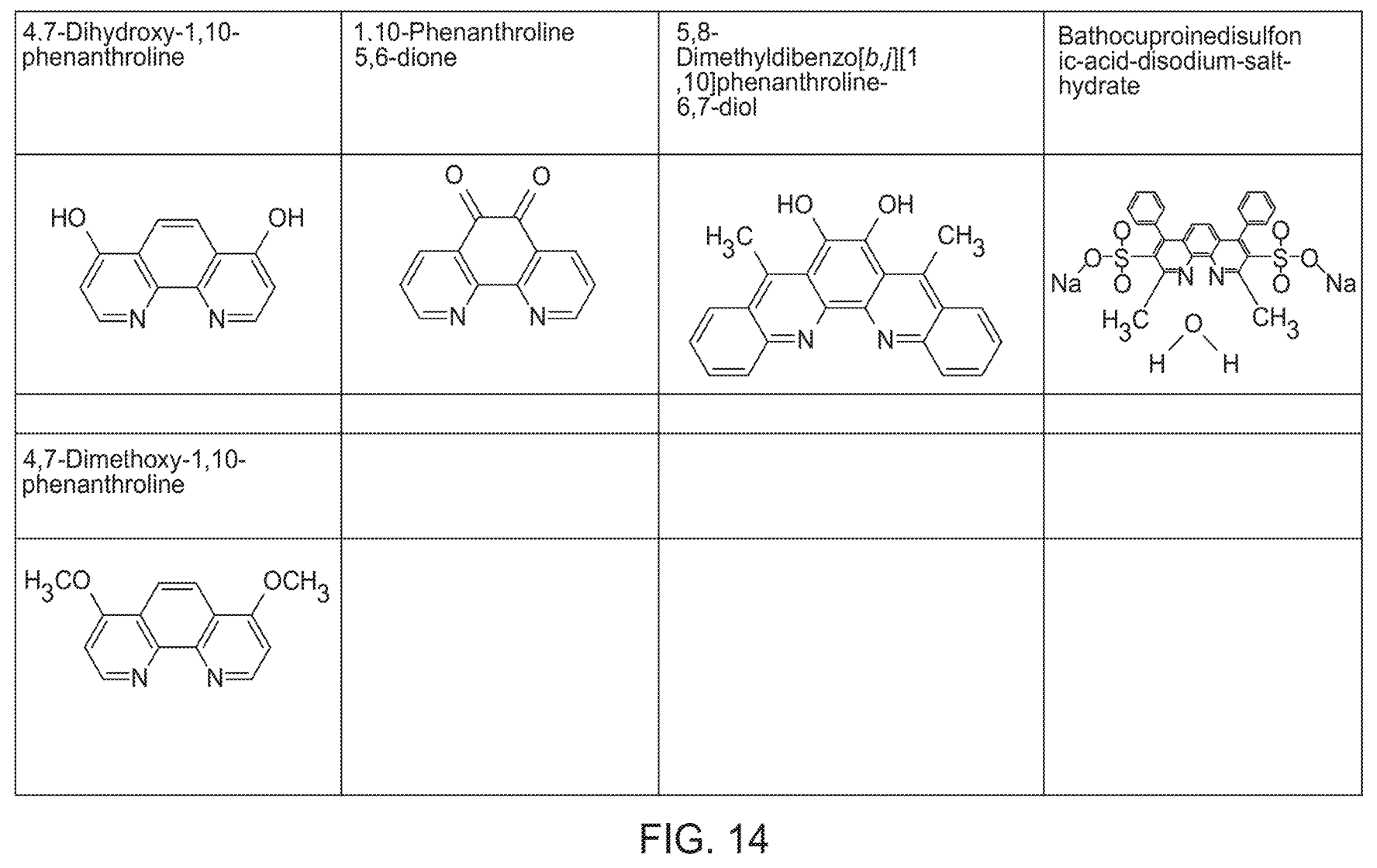

| 4,7-Dihydroxy-1,10-phenanthroline | 1,10-Phenanthroline 5,6-dione | 5,8-Dimethyldibenzo[b,j][1,10]phenanthroline-6,7-diol | Bathocuproinedisulfonic-acid-disodium-salt-hydrate |
|---|---|---|---|
| | | | |
| 4,7-Dimethoxy-1,10-phenanthroline | | | |

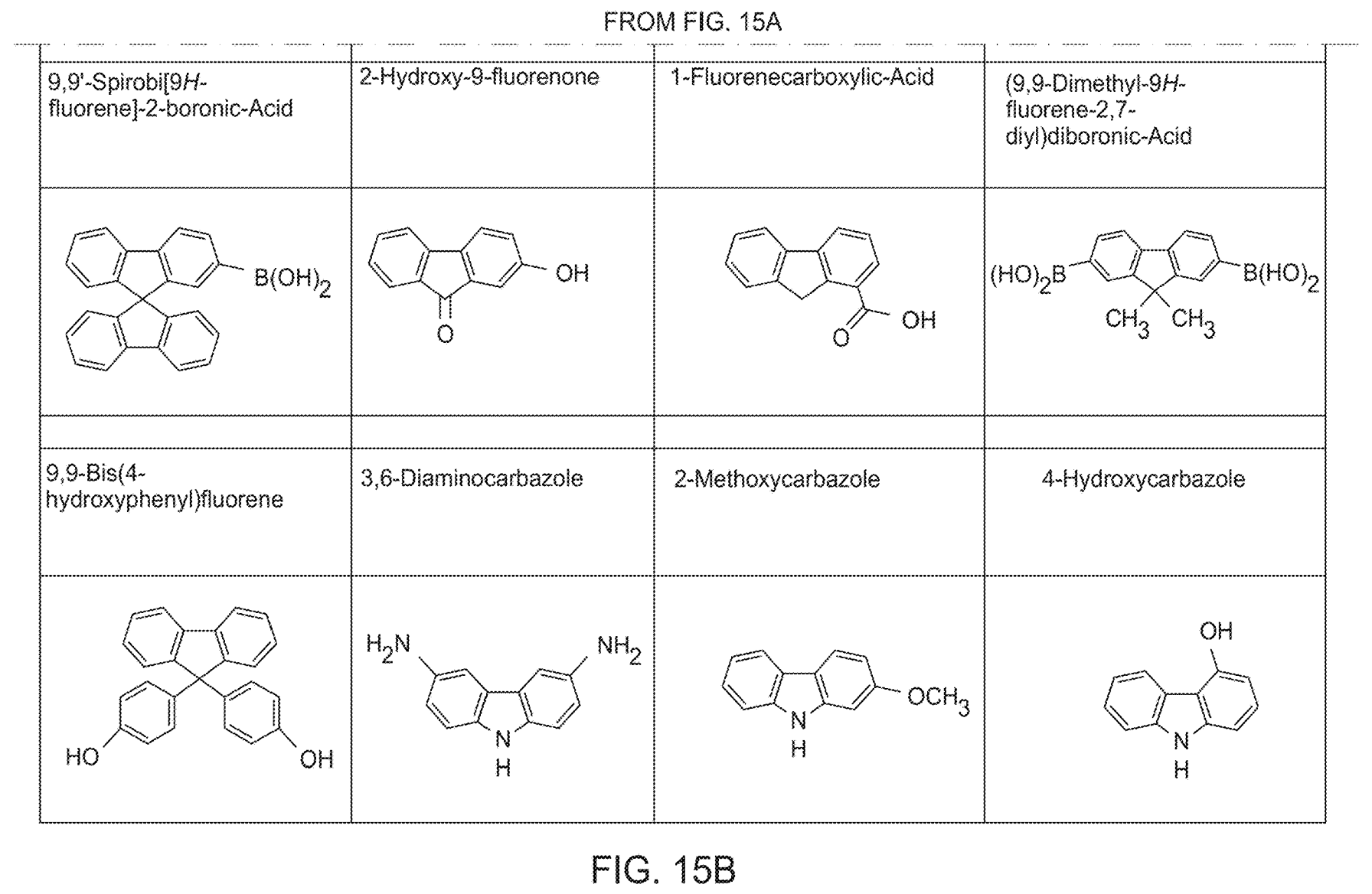

FROM FIG. 15A

| 9,9'-Spirobi[9H-fluorene]-2-boronic-Acid | 2-Hydroxy-9-fluorenone | 1-Fluorenecarboxylic-Acid | (9,9-Dimethyl-9H-fluorene-2,7-diyl)diboronic-Acid |
|---|---|---|---|
| 9,9-Bis(4-hydroxyphenyl)fluorene | 3,6-Diaminocarbazole | 2-Methoxycarbazole | 4-Hydroxycarbazole |

FIG. 15B

ORGANIC-INORGANIC ADHESION LAYER AND ITS USE IN PEROVSKITE SOLAR CELLS AND MODULES

CROSS-REFERENCE TO RELATED APPLICATIONS

This application claims benefit of U.S. provisional patent application Ser. No. 63/379,094, filed Oct. 12, 2022, which is herein incorporated by reference.

BACKGROUND

Field

Embodiments of the present invention generally relate to photovoltaic module products, such as photovoltaic cells, photovoltaic modules and methods of making the same.

Description of the Related Art

Thin-film metal-halide perovskite (MHP) photovoltaic (PV) solar cells are one of the most promising solar technologies developed in the past 20 years. Many of the processes for fabricating perovskite solar cells, such as electrode deposition, heterojunction layer deposition, scribing, and module lamination can draw directly from pre-existing manufacturing processes and tools developed for solar panels or other thin-film technologies. However, perovskite absorber film stacks pose unique processing challenges that have no analogs in current solar manufacturing.

However, it is believed that metal-halide perovskite photovoltaic solar cells are a promising pathway to making durable high-efficiency PV module products. Metal-halide perovskite layers are often deposited as part of a multilayer stack of thin films, which may be used for photovoltaics, and have also found applications in light-emitting diodes, photodetectors, and lasers, among other applications. The metal-halide perovskite is often employed as an intrinsic or near-intrinsic semiconductor sandwiched between two carrier-selective materials to form a diode structure, and those three layers themselves are often sandwiched between two degenerately-doped semiconductors or metals that serve as electrodes, as depicted in FIG. 1. However, these types of perovskite solar cells often exhibit poor adhesion and/or cohesion between the layers formed within the layers used to form the perovskite solar cell stack, and especially at the interfaces formed between organic materials and inorganic materials disposed within the multilayer stack of thin films used to form the solar cell device. The poor adhesion and/or cohesion between the layers will affect the long-term performance of semi-transparent perovskite solar cells and modules. This problem is novel to perovskite solar cell devices, since analogous technologies generally do not include stacked layers that include interfaces between organic and inorganic materials.

Therefore there is a need for photovoltaic module products, such as photovoltaic cells, photovoltaic modules and methods of making the same that solve the problems described above.

SUMMARY

Embodiments of the disclosure include an electronic device comprising a first electrode, a second electrode, a first layer disposed between the first electrode and the second electrode, the first layer comprising a metal-halide perovskite material, and an adhesive layer disposed between the first layer and the second electrode, wherein the adhesive layer comprises an organic material. Embodiments of the disclosure generally relate to photovoltaic module products, such as photovoltaic cells, photovoltaic devices and photovoltaic modules that include an absorber layer that comprise a perovskite material. The organic material may have at least one of an electronic mobility of $1 \times 10^{-5}$ cm$^2$/V/s or greater, a bandgap of 2 eV or greater, a conduction band level of $-5.5$ eV or less with respect to vacuum level, and an optical transmission of greater than 90% for photons having a wavelength in a range from about 700 nm to about 1,200 nm. The adhesive layer can have a thickness in a range from about 0.5 nm to about 200 nm. The organic material may also include molecules with a core group and chelating termination moieties. The organic material may also include a compound having a molecular weight in a range from about 100 g/mol to 2,000 g/mol, a compound having a molecular weight in a range from greater than 2,000 g/mol to 10,000 g/mol, or a compound having a molecular weight in a range from greater than 10,000 g/mol to about 1,000,000 g/mol. In some embodiments, the adhesive layer is an electron-selective layer or a hole carrier-selective layer.

Embodiments of the disclosure also include an electronic device comprising An electronic device comprising a first electrode, a second electrode, a first layer disposed between the first electrode and the second electrode, the first layer comprising a metal-halide perovskite material, and a second layer disposed between the first layer and the second electrode. The second layer can include one or more conjugated or non-conjugated core material groups and one or more termination moieties. The core material groups can be selected from bipyridine, naphthalene, perylene, phenanthroline, fluorene, triarylamine, carbazole, other rylene type material groups, other aromatic or nonaromatic conjugated groups, and linear or branched alkyl chains. The termination moieties can be selected from diols, hydroxyls, hydroxymethyls, carboxylates, aldehydes, carboxylic acid, boronic acid, methoxy, tetrone, carbonyl, or amino-N-oxide, thiols, thioesters, sulfides, sulfoxides, sulfilimines, thioketones, thioaldehydes, S-oxides, S,S-dioxides, sulfenes, thiocarboxylic acids, sulfonic acids, sulfenic acids, sulfonate esters, and sulfoxonium.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 8A, 8B, 8C and 8D schematically illustrates metal-halide perovskite type of solar cell structures that include a layer that has adhesive properties.

FIGS. 13A-13B include a list of example molecules of a first class or a second class of organic layers that include an improved adhesion or cohesion property, according to one or more embodiments of the disclosure.

FIG. 14 includes examples of BCP analogs that have adhesion-promoting moieties that relate to the second class criteria, according to one or more embodiments of the disclosure.

FIGS. 15A-15B includes examples of hole carrier-selective material analogs that have adhesive moieties that relate to the second class criteria, according to one or more embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
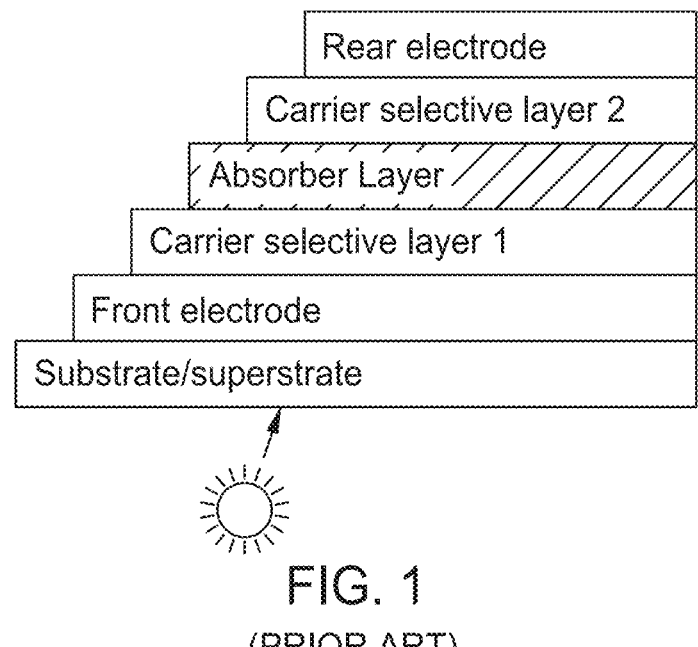
FIG. 1 schematically illustrates a conventional metal-halide perovskite type of solar cell structure.

Embodiments of the disclosure generally relate to photovoltaic module products, such as photovoltaic cells (e.g., solar cells), photovoltaic devices and photovoltaic modules that include one or more absorber layers that comprise a perovskite material. As discussed further herein, embodiments of the disclosure include an improved perovskite solar cell architecture that includes one or more buffer layers disposed within the multilayer stack of thin films used to form a solar cell that can exhibit high solar cell performance (>10% efficiency), and provide stronger adhesion between adjacent layers and/or cohesion within a layer within the multilayer stack used to form the solar cell device. One will note that while most of the embodiments disclosed herein relate to semi-transparent perovskite solar cells and modules, the disclosure provided herein is applicable to applications where a thin-film adhesion-promoting layer is needed between layers of a multilayer stack of thin films, such as between adjacent layers where a first layer includes an organic material and a second layer includes an inorganic material. Embodiments of the disclosure may be useful in multiple applications such as organic light emitting diodes, polymer light emitting diodes, quantum dot light emitting diodes, thin-film oxides on plastic for flexible electronics or anti-fouling or sealing, organic solar cells, dye-sensitized solar cells, or other useful applications.

The light-to-electricity conversion efficiencies of single-junction photovoltaic cells (e.g., solar cells) are limited by entropic and enthalpic mechanisms which traditionally lead to a peak efficiency of 33-34% under standard one-sun testing conditions. As commercial solar technologies, such as silicon, reach close to their practical limits, further improvements to solar cell and module efficiency are sought through the use of tandem devices. In a tandem device, two or more major light-absorbing semiconductors are used to split the incoming solar spectrum and increase the efficiency of the device as compared to a single absorber containing photovoltaic cell. For example, it has been found that a double-junction tandem photovoltaic cell can achieve a peak efficiency of 46% under standard testing conditions. In such a tandem, the absorber arrayed closer to the incoming light is designed to absorb higher-energy photons by having a higher bandgap energy, while the absorber arrayed further away from the incoming light is designed to absorb lower-energy photons by having a lower bandgap energy.

FIGS. 2 and 8A-8D illustrate examples of the upper portion of the tandem structure that includes the higher bandgap energy absorber layer. As noted above, metal-halide perovskite (MHP) photovoltaic (PV) solar cells are a promising pathway to making durable high-efficiency PV module products. An absorber layer that includes the metal-halide perovskite is often employed as an intrinsic or near-intrinsic semiconductor sandwiched between two carrier-selective materials to form a diode structure.

Figure 2:
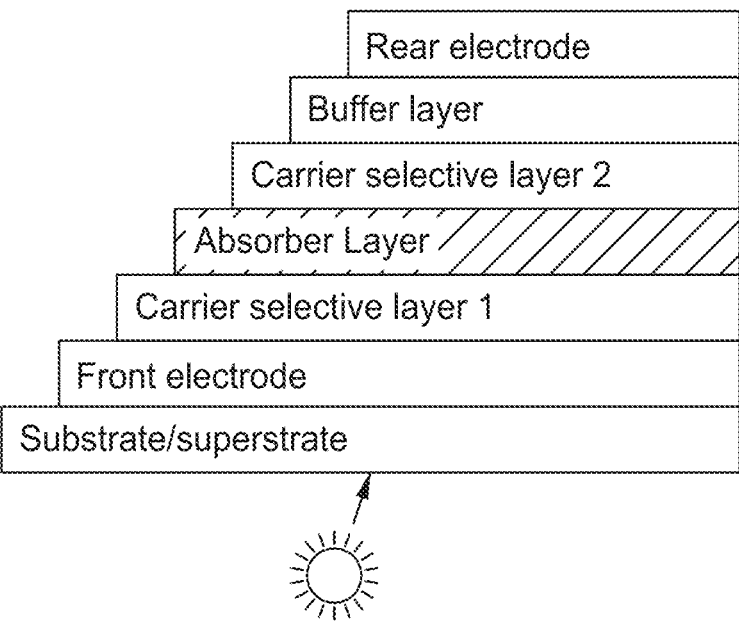
FIG. 2 schematically illustrates a metal-halide perovskite type of solar cell structure that includes a buffer layer that is disposed between a carrier selective layer and an electrode, according to one or more embodiments of the disclosure.

In some MHP solar cell designs a buffer layer is inserted between one or more of the carrier selective layers and the adjacent electrode with the aim of improving carrier selectivity, as depicted in FIG. 2. In MHP solar cells, carrier selective layers are often organic, including hole carrier-selective materials such as the polymer PTAA (poly triarylamine) and the small molecule spiro-OMeTAD (2,2',7,7'-tetrakis(N, N-di-p-methoxyphenyl-amine)9,9'-spirobifluorene) and electron-selective materials, such as C60 fullerene and its analogs and derivatives thereof, which are commonly coupled with the small molecule BCP (bathocuproine, 2,9-dimethyl-4,7-diphenyl-1,10-phenanthroline) as a buffer layer to improve the electron selectivity properties.

Figure 3:
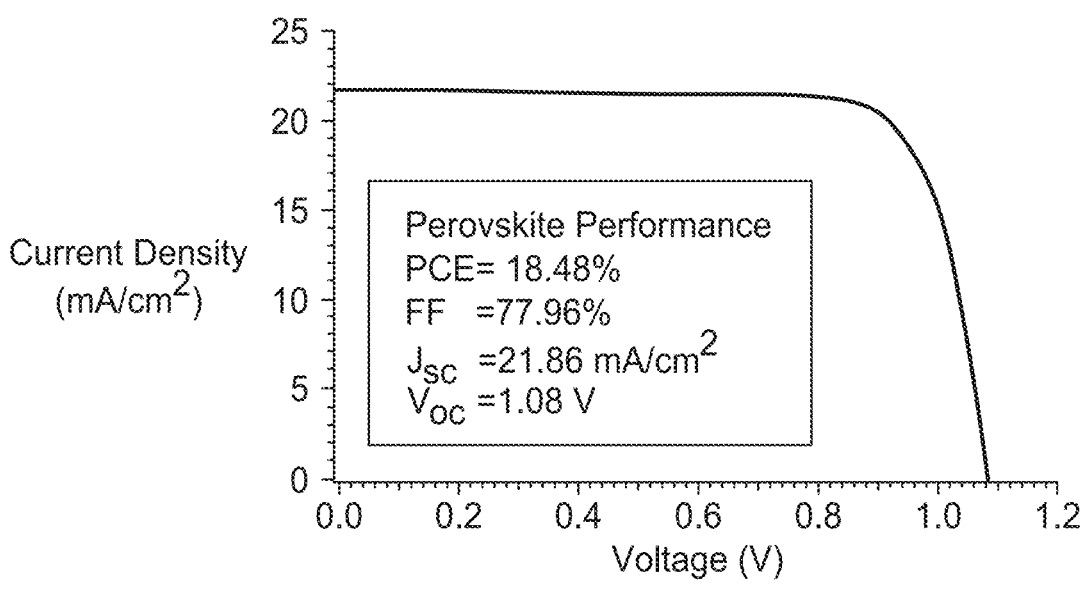
FIG. 3 Illustrates an example of a current-density versus voltage curve (JV curve) of a semi-transparent PIN perovskite solar cell that includes an electron carrier-selective layer (ETL) and a buffer layer, according to one or more embodiments of the disclosure.

In some embodiments of a tandem photovoltaic cell structure, the higher-energy photon absorbing portion of the device is a semi-transparent superstrate PIN structure in which one or more hole carrier-selective layers (HTLs) are first formed on a substrate, a perovskite film is formed on the HTL(s), and one or more electron carrier-selective layers (ETLs) are formed on the absorber layer that includes the perovskite film. It has been found that the solar cell sun light-to-electricity conversion efficiency can be increased by inserting a thin buffer layer at the interface between the ETL(s) and the adjacent transparent electrode (FIG. 2), such as an electron-selective material that includes BCP. PIN architecture perovskite solar cells and modules that include an architecture such as superstrate/front TCO/HTL/Perovskite/ETL/Buffer Layer/rear electrode can be made highly efficient, as evidenced by the example shown in FIG. 3. FIG. 3 illustrates a current-density versus voltage (JV) plot for a semi-transparent PIN type of perovskite solar cell that includes a C60 fullerene containing ETL and a BCP containing buffer layer, wherein full structure is superstrate/front TCO/HTL/perovskite/ETL comprising C60/BCP buffer layer/rear TCO. The configuration of the semi-transparent PIN included a glass containing superstrate, a front transparent conductive oxide (TCO) that included ITO and a rear transparent conductive oxide (TCO) that included IZO.

Figure 4:
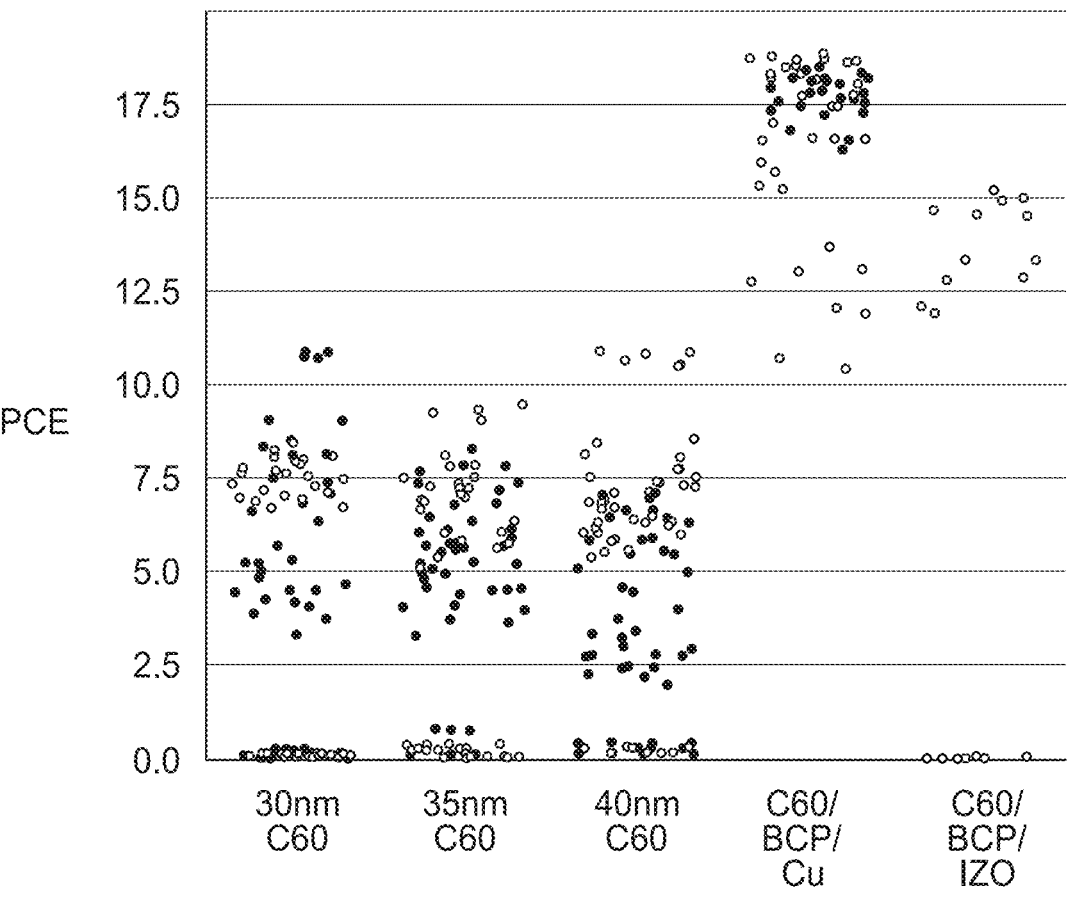
FIG. 4 illustrates an example of the performance of perovskite solar cell structures that include ETL layers, fullerenes and optionally bathocuproine (BCP) containing buffer layers, according to one or more embodiments of the disclosure.

It has been found that the incorporation of a buffer layer into a solar cell device's architecture is important when the ETL includes C60 fullerenes, in large part due to a poor electron selectivity between the C60 fullerenes and the rear electrode. This can be seen clearly in FIG. 4, where the performance of the perovskite solar cells that include ETL layers that include C60 fullerenes without the BCP containing buffer layer suffer significantly reduced performance (e.g., power conversion efficiency (PCE) performance) compared to cells that include a BCP containing buffer layer. The solar cell device architecture illustrated in FIG. 4 included PIN perovskite solar cells that included C60/IZO interfaces, where the C60 thickness was varied (i.e., 30 nm, 35 nm, 40 nm thicknesses), and PIN perovskite solar cells that included a C60/BCP/Cu interface or a C60/BCP/IZO interface.

Figure 5A:
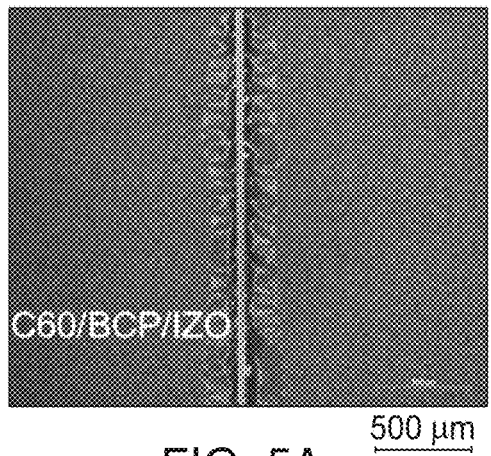
FIGS. 5A, 5B and 5C illustrate laser scribe patterns formed in metal-halide perovskite thin-film devices that include significant scalloping.
Figure 5B:
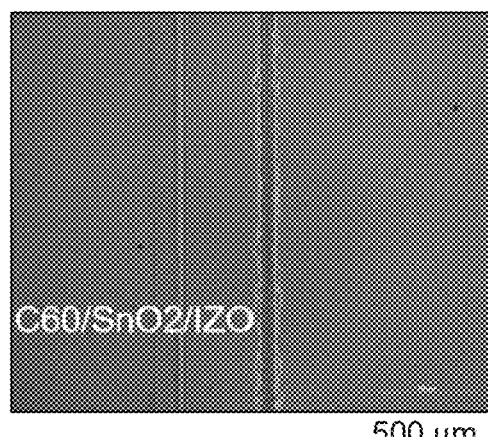

However, conventional PIN architecture perovskite solar cells and modules of architecture superstrate/front TCO/HTL/Perovskite/ETL/Buffer Layer/rear electrode can exhibit poor adhesion between the ETL/buffer layer, hereafter referred to collectively as the ETLB, and the back electrode—whether a TCO or a metal. This problem is especially evident when the ETL (n-type) layer(s) include a fullerene containing layer, such as a buckminsterfullerene (C60) layer, and a buffer layer that includes bathocuproine (BCP). It has been found that the BCP material does not mechanically adhere well to the back electrode material, such as a material that includes IZO. It is believed that this mechanical adhesion issue has been observed also between BCP and metal containing back electrodes, such as Cu or Ag containing back electrodes and also observed in NIP architecture solar cells between the spiro-OMeTAD HTL and metal back electrodes such as Au or Ag. It is thus believed that in at least metal-halide perovskite thin-film devices, poor adhesion may be present at interfaces between organic materials and inorganic materials. In the case of BCP and IZO interfaces, this problem is evidenced by scalloping of the IZO electrode during thin-film scribing used to form monolithic interconnects which pattern a thin-film solar module. As used herein, the term "scalloping" refers to cracking and/or adhesion failure found adjacent to and often over a much wider lateral distance than the scribe width itself, as illustrate in FIG. 5A. In this example, the C60/BCP/IZO module architecture can include significant scalloping on the order of 100 microns width. In another example, as shown in FIG. 5B, a C60/SnO2/IZO module architecture experiences moderate scalloping, approximately 40 microns width. However, a C60/IZO module architecture, which doesn't include a buffer layer experiences less scalloping, around 10 microns width, implying better adhesion between the C60 and IZO than between BCP and IZO, although the scalloping issue is still present.

It has been found that adhesion between the ETLB and rear TCO layer can be improved by replacing the BCP buffer layer with a buffer layer comprising tin oxide (SnOx) deposited by atomic layer deposition (ALD). However, this solution is less commercially appealing due to the high cost and low throughput of ALD.

Improved Photovoltaic Module Products

Figure 6:
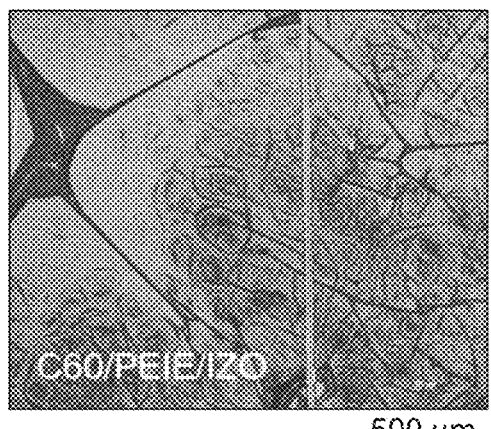
FIG. 6 illustrates a laser scribe pattern formed in a metal-halide perovskite thin-film device that include minimal scalloping due to the incorporation of an adhesive layer.

Due to the high material cost, high capital cost and low throughput of ALD processes, a new buffer layer that has improved adhesion properties that allows the buffer layer to bind the organic and inorganic material layers together to improve adhesion and thus reduce the scalloping during laser scribing processes is needed. This new type of buffer layer can be used in place of or in addition to traditional buffer layers or in place of either or both the carrier selective layer and the buffer layer. FIGS. 8A-8D illustrate various metal-halide perovskite (MHP) photovoltaic (PV) solar cell multilayer stacks that include an adhesive layer that is used to bind both organic and inorganic material layers within the multilayer stack. In one example of an adhesive layer is shown in FIG. 6, which illustrates a structural improvement that can be achieved after performing a scribing process when using an adhesive layer that is configured to act as an adhesive buffer layer. In this example, the adhesive buffer layer includes a polymer PEIE (polyethylenimine, 80% ethoxylated), for which the amine and ethylene groups interact strongly with the C60 and the ethoxylates chelate to the metals within the TCO. However, in some embodiments, the adhesive buffer layer includes hydroxyl groups and/or alkoxyl groups (e.g., methoxy, propoxy, etc.). As shown in FIG. 6, the laser scribed C60/PEIE/IZO module architecture includes no measurable scalloping on the edge of the P3 scribe, confirming stronger adhesive and/or cohesive bonds.

Figure 5C:
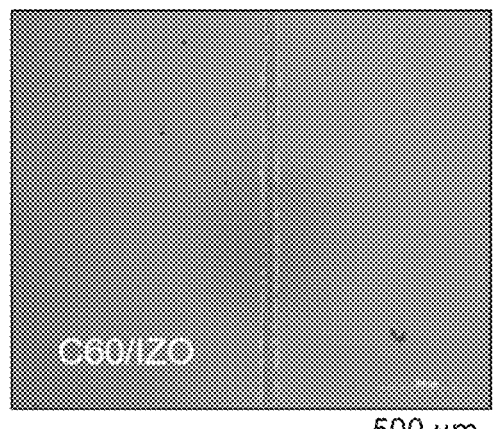

The delamination and/or scalloping of an oxide layer (e.g., a TCO which may include an ITO, IZO or other similar layer) created by a laser scribing process is important for long-term performance of semi-transparent perovskite solar cells and modules. In one example, delamination can lead to cell/module failure either by buckling of the electrode or by scalloping of the TCO from the ETL/TCO interface. From the experiments undertaken in relation to FIGS. 5A-5C, our current understanding is that failure exists at the BCP/IZO interface. As noted above, this problem is novel to this solid-state solar cell application, as analogous technologies do not have this interface. For example, dye-sensitized solar cells have a liquid or gel electrolyte between the solid layers and the rear electrode. Organic LEDs, another analogous technology, generally deposit a metal layer on the semiconductor stack, regardless of inverted or standard architecture. ITO sputtered onto PET is a common product which has a direct organic/TCO interface, but this adhesion relies on multiple factors including embedding sputtered atoms into the PET, a strategy which is unavailable in the perovskite solar cell architecture as such a strategy would damage the electronic properties of the semiconductor layers.

Figure 7A:
FIGS. 7A and 7B each illustrate the delamination of an electrode layer from a perovskite solar cell device that was caused by a laser scribing process.
Figure 7B:
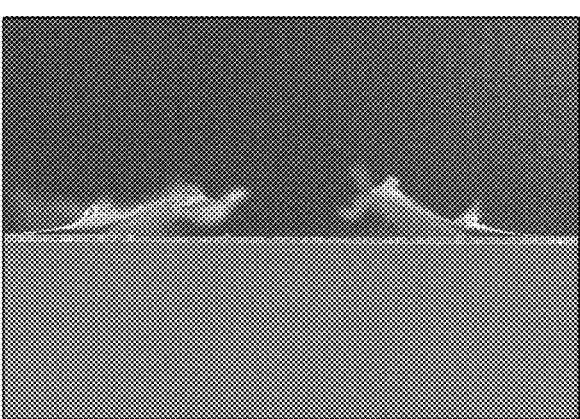

Delamination and/or scalloping is not limited to the PIN structure. Poor adhesion between an organic and an oxide layer (e.g., TCO) may also occur in NIP architecture semi-transparent solar cells that terminate with an organic p-type semiconductor for the HTL layer, commonly PTAA or spiro-OMeTAD. Delamination is further not limited to poor adhesion between an organic layer and an oxide layer, and can be observed between an organic layer and a metal layer as well, as shown in FIGS. 7A-7B. As shown in FIGS. 7A and 7B, delamination of electrode layers from the perovskite solar cell stack can be created as a result of laser scribing, such as delamination of a transparent conductive oxide from the perovskite solar cell stack (FIG. 7A) and delamination of a metal layer from the perovskite solar cell stack (FIG. 7B).

Photovoltaic Module Product Examples

In some embodiments of the disclosure, photovoltaic module products include a photovoltaic cell that includes either a PIN perovskite architecture or an NIP perovskite architecture. While not intending to limit the scope of the disclosure provided herein, in some embodiments, the photovoltaic module product includes a tandem photovoltaic module that includes a higher-energy photon absorbing stacked structure and a lower-energy photon absorbing structure. In this configuration, the higher-energy photon absorbing structure is disposed between the incoming light (e.g., sun) and the lower-energy photon absorbing structure, and the higher-energy photon absorbing structure is semi-transparent and thus is configured to allow low energy wavelength of light to pass therethrough.

In general, as illustrated in FIGS. 8A-8D, the higher-energy photon absorbing stacked structure will include an absorber layer that includes the metal-halide perovskite that is sandwiched between two carrier-selective material layers. The higher-energy photon absorbing stacked structure also includes a front electrode, a back electrode, a substrate/superstrate and an adhesive material containing layer, which can either be formed as a discrete adhesion promoting layer, and/or as a layer that includes improved cohesion, or form a portion of at least one of the other layers within the stacked structure, as will be described further below. The substrate will include an optically transparent material (e.g., glass), and the electrodes will generally include a transparent semiconducting oxide material such as ITO, IZO, and FTO or metals such as gold, silver, copper, and aluminum.

In some embodiments of the higher-energy photon absorbing stacked structure, the absorber layer includes a metal-halide perovskite (MHP) material. The metal-halide perovskite (MHP) material forms a crystal structure with composition ratio of $ABX_3$ where A is typically a cation including but not limited to methyl ammonium, formamidinium, cesium, rubidium ion; where B is typically a cation including but not limited to a lead cation or tin cation; where X is typically a halide anion including but not limited to chloride, bromide, and iodide. The metal halide perovskite active layer is typically a polycrystalline thin film material with a perovskite crystal structure with a typical band gap between 2 eV and 1 eV and photoluminescence typically between 600 nm and 850 nm. The crystallite domains typically imaged by electron microscopy are usually about 50 nm to 2000 nm when approximated as a circle. The desired thickness of the perovskite active layer is typically between 500 nm and 1200 nm.

The carrier-selective material layers will include a hole carrier-selective layer (or HTL) and an electron carrier-selective layer (or ETL). An HTL includes the hole carrier-selective material that is configured to separate holes versus electrons generated in the absorber layer. The hole carrier-selective material will have electron blocking properties. In general, desirable hole-transport materials will include materials that have (i) a high conductivity, (ii) high transparency (since the sunlight is absorbed by the photoactive layer through the HTL formed on the anode side), (iii) a high stability over the solar cell's lifetime, (iv) high work function (WF) (since the energy level of materials should be appropriate for charge collection), (v) typically have a larger band gap than the absorber layer, and (vi) a good hole mobility. Alternately, an ETL includes an electron carrier-selective material that is configured to separate electrons versus holes generated in the absorber layer. In general, desirable electron-transport materials will include materials that have (i) well aligned energy levels for efficient charge transfer and hole blocking, which reduces open voltage loss and improves electron transport from perovskite to the ETL, (ii) high electron mobility in ETL, which facilitates high efficiency charge extraction from the perovskite films and reduces charge recombination, (iii) a high optical transmittance, which reduces the optical energy loss, (iv) typically have a larger band gap than the absorber layer, and (v) a high stability over the solar cell's lifetime.

In one configuration of a higher-energy photon absorbing structure, a PIN perovskite architecture includes one or more fullerenes, which are an organic material that include a high electron mobility that may be vacuum-processed or solution-processed, is incorporated within the structure and used to transport electrons to the cathodic rear electrode. In some embodiments of the PIN perovskite architecture, or even NIP perovskite architecture, the architecture may include a fullerene such as a C20, C60, C70, C72, C74, C76, C80, C82, C84, C86, C88, C90, C100 or other useful fullerene formula. However, in both PIN and NIP structures, the fullerene (e.g., C60) is generally not used alone. In a PIN architecture, a fullerene is paired with BCP, which is thought to provide "hole-blocking" properties. In the NIP architecture, the one or more fullerenes are commonly paired with $TiO_2$, a traditional electron-selective layer which also possesses "hole-blocking" properties due to its large bandgap.

The lowest unoccupied molecular orbital (LUMO) of BCP is commonly accepted at −3.5 eV with respect to vacuum. The highest occupied molecular orbital (HOMO) of BCP is commonly accepted at −7.0 eV with respect to vacuum. The electron transport properties of BCP are under debate in the scientific community, with one common theory that shallow trap states in the BCP band gap around −4 eV align with the transport level of the perovskite and C60, allowing electron transport through the insulating material.

An improved photovoltaic cell architecture has been developed which includes a front TCO/1st carrier-selective layer/perovskite/2nd carrier-selective layer/buffer layer/rear electrode, wherein the buffer layer includes one or more layer(s) which exhibits a high solar cell performance (>10% efficiency), and stronger adhesion between and/or cohesion within the 2nd carrier-selective layer/buffer layer/rear electrode stack. The improved photovoltaic cell architecture has achieved less electrode scalloping during a P3 scribe, such that the lateral extent of the scalloping on either side of the scribe is preferably less than 80 microns, more preferably less than 40 microns, even more preferably less than 15 microns. The adhesion/cohesion critical fracture energy of the 2nd carrier-selective layer/buffer layer/rear electrode stack is preferably >1 J/m², more preferably >2 J/m², and most preferably >3 J/m². The 2nd carrier-selective layer may be selected from a common set of both electron carrier-selective and hole carrier-selective organic materials, including but not limited to C60, C70, PCBM, spiro-OMeTAD, PTAA, or PTPD. The rear electrode may be selected from a list including but not limited to ITO, IZO, AZO, BZO, $In_2O_3$:H, IMO, $MoO_2$, Ag, Ag, Cu, or Al. It has been recognized that while the embodiment examples for this invention is for semi-transparent perovskite solar cells and modules that the core of this invention is a thin-film adhesion-promoting layer between an organic material and an inorganic material. Embodiments of the disclosure provided herein may be useful between organic materials and inorganic compounds in other applications also such as organic light emitting diodes, polymer light emitting diodes, quantum dot light emitting diodes, thin-film oxides on plastic for flexible electronics or anti-fouling or sealing, organic solar cells, dye-sensitized solar cells, etc.

In a first class of organic buffer layers that have improved adhesion properties, the layer contains a material that is selected from one or more core material groups, which may be conjugated or non-conjugated, and include one or more termination moieties. The one or more core groups include for example bipyridine, naphthalene, perylene, phenanthroline, fluorene, triarylamine, carbazole, other rylene type material groups, other aromatic or nonaromatic conjugated groups, and linear or branched alkyl chains which bond strongly to other organic materials. The one or more termination moieties include for example singly or double bonded oxygen, sulfur, or selenium, and examples of such termination moieties include diols, hydroxyls, hydroxymethyls, carboxylates, aldehydes, carboxylic acid, boronic acid, methoxy, tetrone, carbonyl, or amino-N-oxide, thiols, thioesters, sulfides, sulfoxides, sulfilimines, thioketones, thioaldehydes, S-oxides, S,S-dioxides, sulfenes, thiocarboxylic acids, sulfonic acids, sulfenic acids, sulfonate esters, sulfoxonium. The singly or doubly bonded oxygen, sulfur, or selenium, may improve the adhesion to the transparent conducting oxide by chelation or other binding mechanisms to the metallic atoms in the TCO. The termination moieties, in some cases, also act by coordination with the TCO by hydrogen bonding.

This first class of materials that have adhesion promoting properties may be employed in the PIN architecture described above, to make solar devices with architecture superstrate/front TCO/HTL/Perovskite/C60/BCP/Adhesive Layer (AL)/rear electrode (FIG. 8B) or in architectures which do not employ a buffer layer, superstrate/front TCO/HTL/perovskite/ETL/AL/rear electrode (FIG. 8D). In this first class of materials, it is anticipated that a thin adhesion layer can be deposited without consideration for electronic properties by utilizing an adhesion layer thickness compatible with electron tunneling, for example less than 10 nanometers. Instead, moieties/functional groups are chosen to interact strongly with organic materials such as BCP or C60 and with transparent conducting oxides (TCO) such as IZO or ITO. These materials may be solution-processed or vacuum-processed. Examples of solution processing are spin-coating, blade coating, slot-die coating, spray coating, gravure coating, ink-jet printing. Examples of vacuum processing include evaporation and sputtering.

In the case of vacuum processing, the materials are preferentially chosen to have an appropriate molecular weight, melting point, boiling point, or sublimation temperature suitable for thermal evaporation. The physical properties of the first class of materials are chosen such that the material is a solid at 275K, and has a melting point or sublimation temperature greater than 200° C. and less than 1000° C. in order to be compatible with physical vapor deposition techniques. Organic materials within this melting point range may fall in the molecular weight range of 100 to 10,000 g/mol, and preferentially in the 200 to 2,000 g/mol range.

In the case of solution processing, the materials are preferentially chosen to have an appropriate solubility in solvents and solvent/additive mixtures compatible with underlying materials onto which the adhesion layer is deposited with minimal disruption or damage to earlier formed layers, e.g. the perovskite film and the other portion(s) of the ETL, PEI, PEIE, PET, and PDMS with similar core and terminating moieties as described above are examples of solution-deposited materials in this first class of improved buffer layer materials. These materials may fall into 3 general classes, a molecular weight range of 100 to 2,000 g/mol—small molecules, a molecular weight range of 1,000 to 10,000 g/mol—oligomers, and 10,000 to 1,000,000 g/mol—polymers.

The film of this adhesion layer in the first class of materials is selected to conform to the physical, optical, chemical, and electronic properties of the perovskite solar cell architecture. The transparency of the adhesion layer within the solar cell architecture should be high in the wavelength range between the bandgap of the perovskite and the bandgap of a silicon solar cell, for example, which may be estimated as 700 to 1200 nm. The transmission of photons in this wavelength range is preferentially >90%, more preferentially >97%, and most preferentially >99%. The thickness of the adhesion layer in this first class of materials may need to be thin if not sufficiently electronically conductive. The thickness of this layer can be 0.5 to 200 nm, preferentially 0.5 nm to 10 nm, and most preferentially 0.5 to 5 nm.

Figure 9:
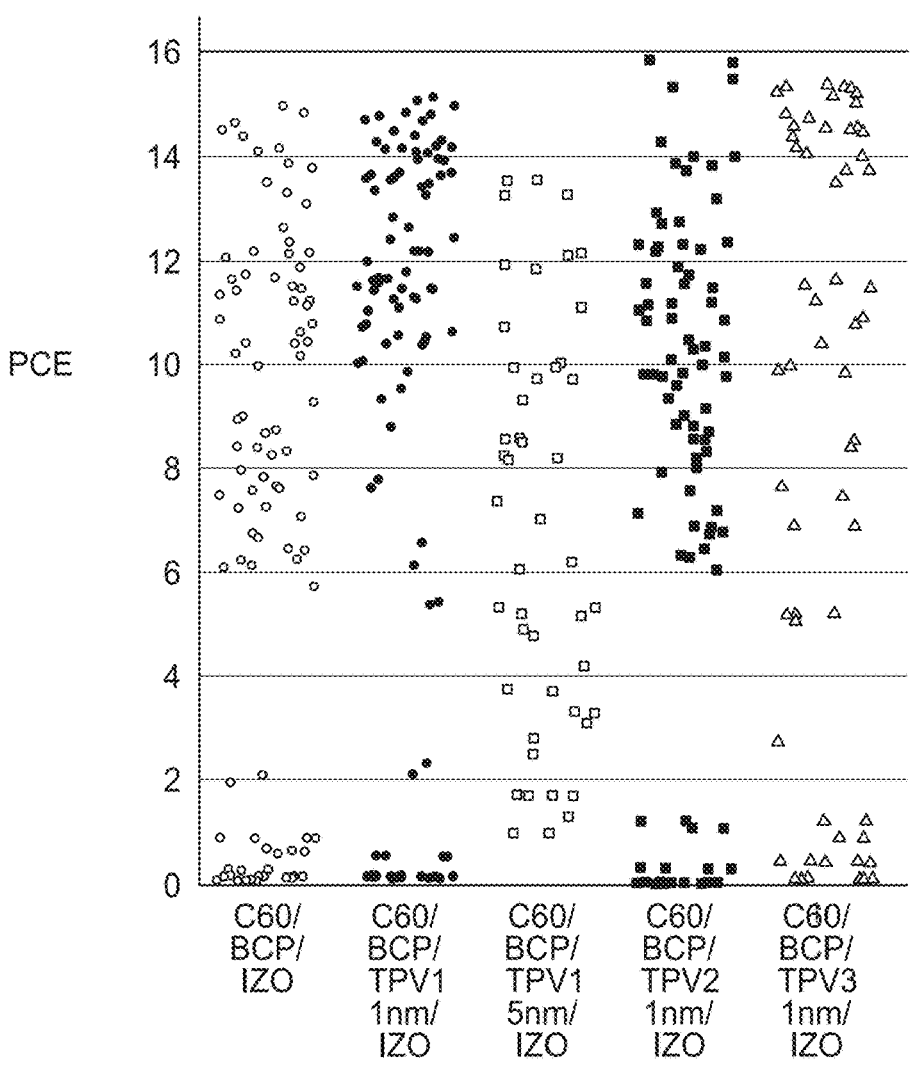
FIG. 9 illustrates an example of the performance of the perovskite solar cell structure illustrated in FIG. 8B, which includes an adhesion layer [AL], according to one or more embodiments of the disclosure.

Examples of the first class of buffer materials of a solar cell structure illustrated in FIG. 8B were tested by fabricating perovskite solar cells with an adhesion layer (AL). FIG. 9 includes results of tests performed on solar cells fabricated with an adhesion layer formed from differing materials and thicknesses, and the PCE results shown in FIG. 9 refer to the power conversion efficiency, and the horizontal axis includes the configuration of the layers deposited on top of the perovskite layer. An adhesion layer consisting of bipyridine-diol (denoted TPV1), bipyridine-dimethoxy (denoted TPV2), and bipyridine-dicarboxylate (denoted TPV3) was developed and tested. In this test, solar cells in each condition with an adhesion layer between 1 nm and 5 nm performed similarly to the C60/BCP/IZO control devices, demonstrating electronic compatibility through tunneling in this thickness range.

Figure 10A:
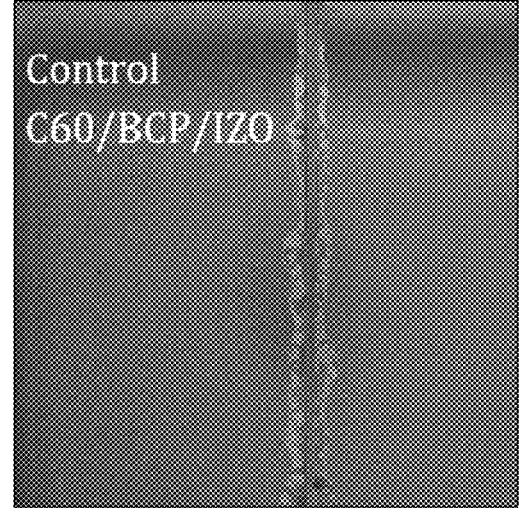
FIG. 10A illustrates a laser scribe pattern formed in metal-halide perovskite thin-film devices that includes a BCP containing layer, according to one or more embodiments of the disclosure.
Figure 10B:
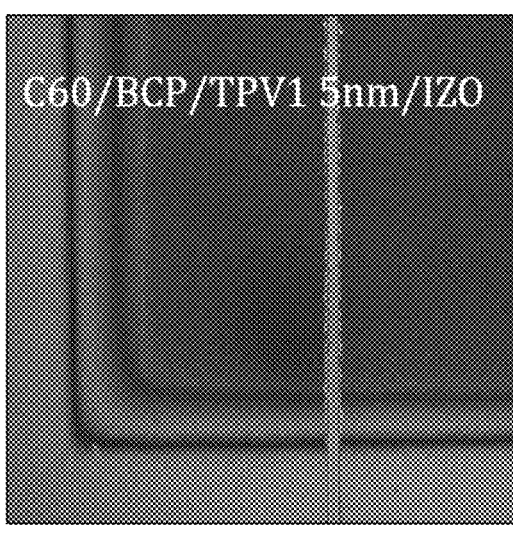
FIG. 10B illustrates a laser scribe pattern formed in metal-halide perovskite thin-film devices that includes a BCP containing layer and an adhesion layer, according to one or more embodiments of the disclosure.

The adhesion-promoting properties of these adhesion layer materials can also be seen by the performance of laser scribing tests, as shown in FIG. 10A-10B. The solar cell in FIG. 10B, exhibits much less scalloping during laser scribing and contains 5 nm of an adhesion layer, as compared to the solar cell in FIG. 10A, which does not contain an adhesion layer. FIG. 10A illustrates the scalloping demonstrated on a perovskite solar cell that included a C60/BCP/IZO layer stacks. FIG. 10B illustrates a reduced amount of scalloping of a perovskite solar cell that included a C60/BCP/5 nm bipyridine-dicarboxylate adhesive layer/IZO layer stack.

In a second class of organic layers with improved adhesion properties, a new class of materials having additional requirements compared to the first class of materials is selected where the buffer materials are conjugated in order to provide a minimum electrical mobility. Examples of core groups of materials included in this second class of improved buffer layer materials are naphthalene, perylene, phenanthroline, fluorene, carbazole and other core groups within the rylene family of structures. The same termination moieties are possible with the second class of materials as in the first class, namely for example singly or double bonded oxygen, sulfur, or selenium, and examples of such termination moieties include diols, hydroxyls, hydroxymethyls, carboxylates, aldehydes, carboxylic acid, boronic acid, methoxy, tetrone, carbonyl, or amino-N-oxide, thiols, thio-esters, sulfides, sulfoxides, sulfilimines, thioketones, thioal-dehydes, S-oxides, S,S-dioxides, sulfenes, thiocarboxylic acids, sulfonic acids, sulfenic acids, sulfonate esters, sulfoxonium.

The second class of organic layers with improved adhe-sion may be employed to replace in part or completely a buffer layer material (e.g., BCP containing layer) and/or a carrier-selective layer (e.g., C60 containing layer) in the PIN architecture above, such that the cell architecture is a super-strate/front TCO/HTL/Perovskite/C60/AL/rear electrode (FIG. 8A) or superstrate/front TCO/HTL/Perovskite/AL/rear electrode (FIG. 8C). As illustrated in FIG. 8A, an adhesive layer formed from the second class of organic layers can be employed to function as an adhesive barrier layer that is disposed between a carrier-selective layer and the rear electrode. As illustrated in FIG. 8C, an adhesive layer formed from the second class of organic layers can be employed to function as an adhesive carrier-selective layer. In this second class of materials, the moieties/functional groups have been analyzed that provide adhesion to organic materials and/or with oxides. The molecules have also been selected to provide the "hole blocking" properties of a buffer layer (e.g., BCP) which necessitates a certain bandgap alignment and a minimum electron conductivity.

This second class of materials conforms to the physical, optical, chemical, and electronic properties of the first class of materials with additional definitions. Additionally, the second class of materials requires a minimum electronic mobility, at minimum $>1\times10^{-5}$ cm$^2$/V/s, preferentially $>1\times10^{-4}$ cm$^2$/V/s, and most preferentially $>1\times10^{-3}$ cm$^2$/V/s. This second class of materials should have a lowest unoc-cupied molecular orbital (LUMO) or valence band level no further negative than $-3.8$ eV with respect to vacuum level. This second class of materials should have a bandgap no smaller than 2 eV, preferentially a bandgap $>2.5$ eV, and most preferentially a bandgap $>3$ eV. This second class of materials should have a highest occupied molecular orbital (HOMO) or conduction band level no further positive than $-5.5$ eV with respect to vacuum level, preferentially no further positive than $-6.0$ eV, and most preferentially no further positive than $-7$ eV. The thickness of this layer can be 0.5 to 200 nm, preferentially 0.5 to 40 nm, and most preferentially 0.5 to 20 nm.

Figure 11:
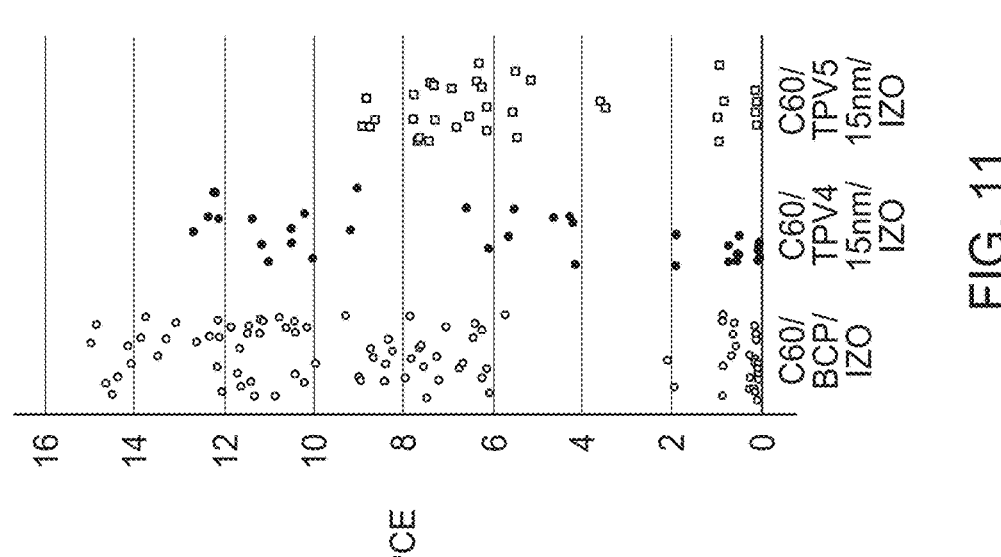
FIG. 11 illustrates an example of the performance of perovskite solar cell structures, which optionally include an adhesion layer, according to one or more embodiments of the disclosure.

Examples of this second class of buffer materials of a solar cell structure illustrated in FIG. 8A were tested by fabricating perovskite solar cells with adhesion layer is shown in FIG. 11. In one example, an adhesion layer consisting of 1,4,5,8-Naphthalenetetracarboxylic dianhy-dride [TPV4] and NDI-Cyclohexane [TPV5] was devel-oped. In this example, the typical 15 nm of BCP was replaced with 15 nm of adhesion layer. FIG. 11 includes power conversion efficiency (PCE) results for solar cells fabricated with an adhesion layer that includes differing materials and thicknesses, as shown along the horizontal axis.

Figure 12B:
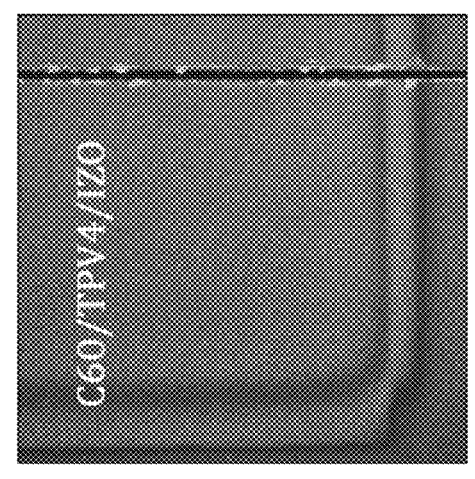
FIGS. 12B, and 12C illustrate laser scribe patterns formed in metal-halide perovskite thin-film devices, formed similarly to the structural configuration illustrated in FIG. 8A, that do not include significant scalloping.
Figure 12A:
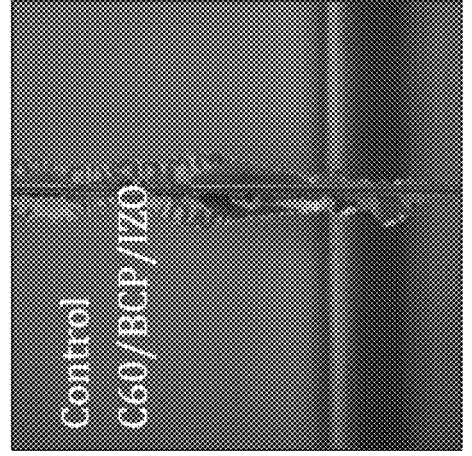
FIG. 12A illustrates a laser scribe pattern formed in a metal-halide perovskite thin-film device that do not include an adhesion layer and as illustrated include significant scalloping.
Figure 12C:
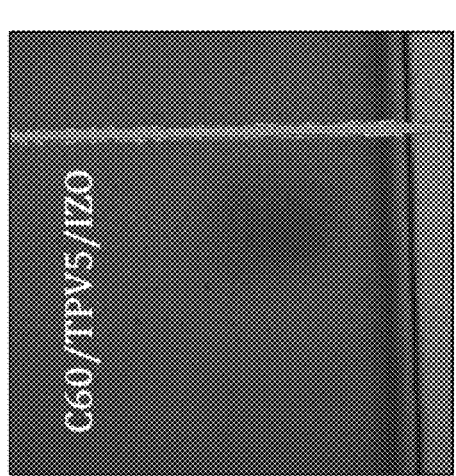

The adhesion-promoting properties of these adhesion layer materials can also be seen by the performance of laser scribing tests, as shown in FIGS. 12A-12C. The solar cells in FIGS. 12B and 12C, exhibited much less scalloping after laser scribing than the solar cell in FIG. 12A. The solar cells illustrated in FIGS. 12B and 12C contained 15 nm of an adhesion layer, as compared to the solar cell depicted in FIG.

Figure 13A:
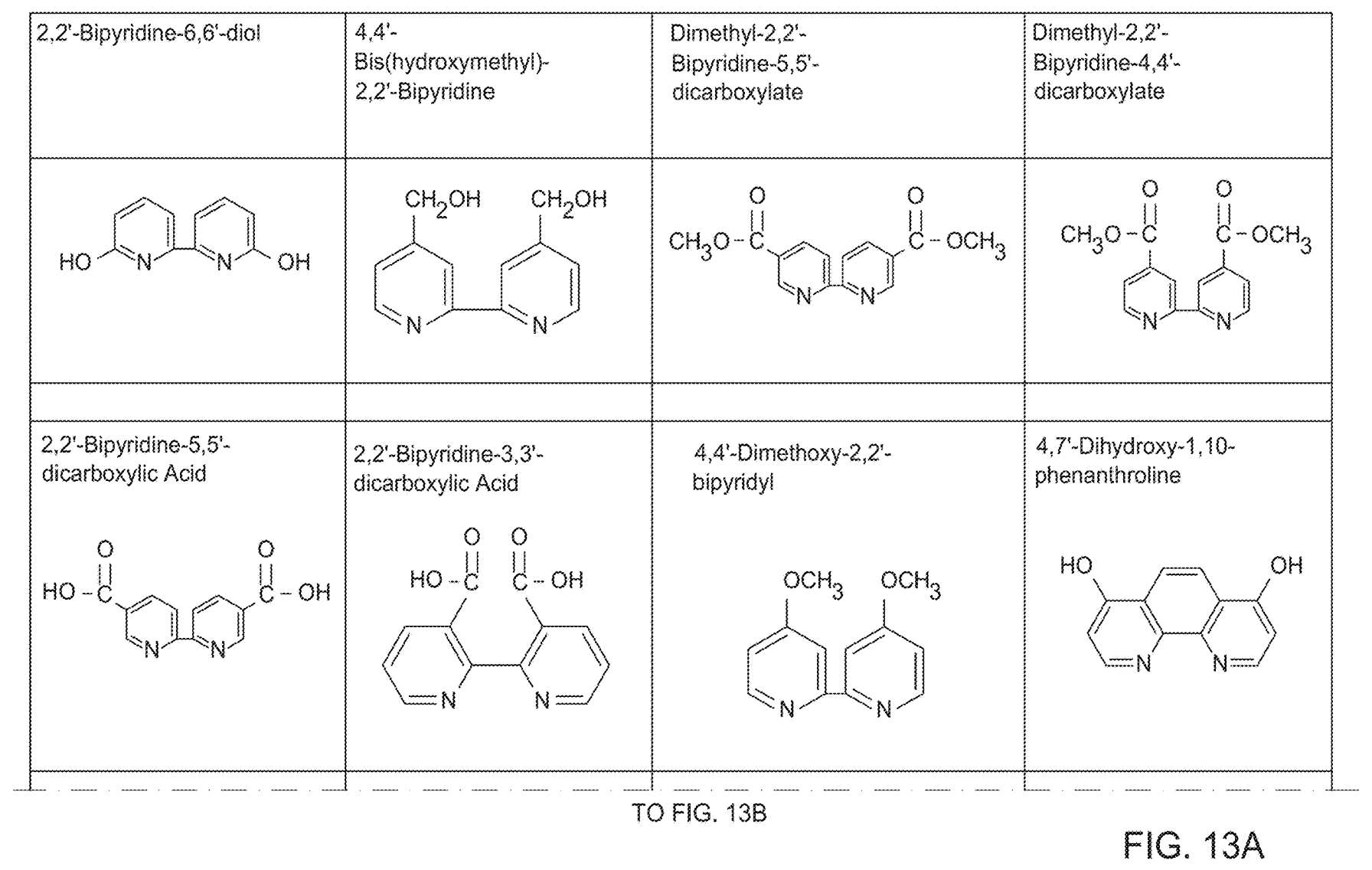

12A which did not contain an adhesion layer. FIG. 12A illustrates scalloping formed on a perovskite solar cell that included a C60/BCP/IZO layer stack. FIG. 12B illustrates minimal scalloping formed on a perovskite solar cell that included a C60/TPV4/IZO layer stack. FIG. 12C illustrates a perovskite solar cell that included almost no scalloping for a C60/TPV5/IZO layer stack. In FIGS. 13A-13B includes a list of example molecules which are believed to meet the criteria laid out in the first class or second class of organic layers that include an improved adhesion or cohesion prop-erty. In some embodiments, the adhesion layer of the first class type can include one or more molecules such as: 2,2'-bipyridine-6,6'-diol; 4,4'-bis(hydroxymethyl)-2,2'-bi-pyridine; dimethyl 2,2'-bipyridine-5,5'-dicarboxylate; dim-ethyl 2,2'-bipyridine-4,4'-dicarboxylate; 2,2'-bipyridine-5, 5'-dicarboxylic acid; 2,2'-bipyridine-3,3'-dicarboxylic acid; 4,4'-dimethoxy-2,2'-bipyridyl; 4,7-dihydroxy-1,10-phen-anthroline; 1,10-phenanthroline-5,6-dione; 1,4,5,8 naphtha-lenetetracarboxylic dianhydride; 2,7-dihexylbenzo[lmn][3, 8]phenanthroline-1,3,6,8(2H,7H)-tetrone; 1,3,6,8(2H,7H)-tetraone,2,7-dicyclohexylbenzo[lmn][3,8]phenanthroline; 2,9-bis[2-(4-fluorophenyl)ethyl]anthra[2,1,9-def: 6,5,10-d' e'f']diisoquinoline-1,3,8,10(2H,9H)tetrone; N,N'-di(4-py-ridyl)-1,4,5,8-naphthalenetetracarboxthimide; 1,8:4,5-naph-thalenetetracarboxthimide: salts thereof or any combination thereof.

In some embodiments, the adhesion layer structure can be created by co-depositing an adhesion layer material with a buffer layer material (e.g., BCP material), either by solution or vacuum deposition, creating a compound layer with both materials. In some embodiments, the adhesion layer struc-ture may also be practiced through modification of the buffer layer material, such as the BCP molecule to create analogs (FIG. 14), each of which would fall under the second category of molecules, as the core of the BCP molecule is phenanthroline, a conjugated molecule. FIG. 14 includes examples of BCP analogs with phenanthroline cores which have adhesion-promoting moieties which may meet the second class criteria. In some embodiments, the adhesion layer of the second class type can include one or more molecules such as: 4,7-dihydroxy-1,10-phenanthroline; 1,10-phenanthroline-5,6-dione; 5,8-dimethyldibenzo[b,j][1, 10]phenanthroline-6,7-diol; bathocuproinedisulfonic acid disodium salt hydrate; 4,7-dimethoxy-1,10-phenanthroline; salts thereof or any combination thereof.

Figure 15A:
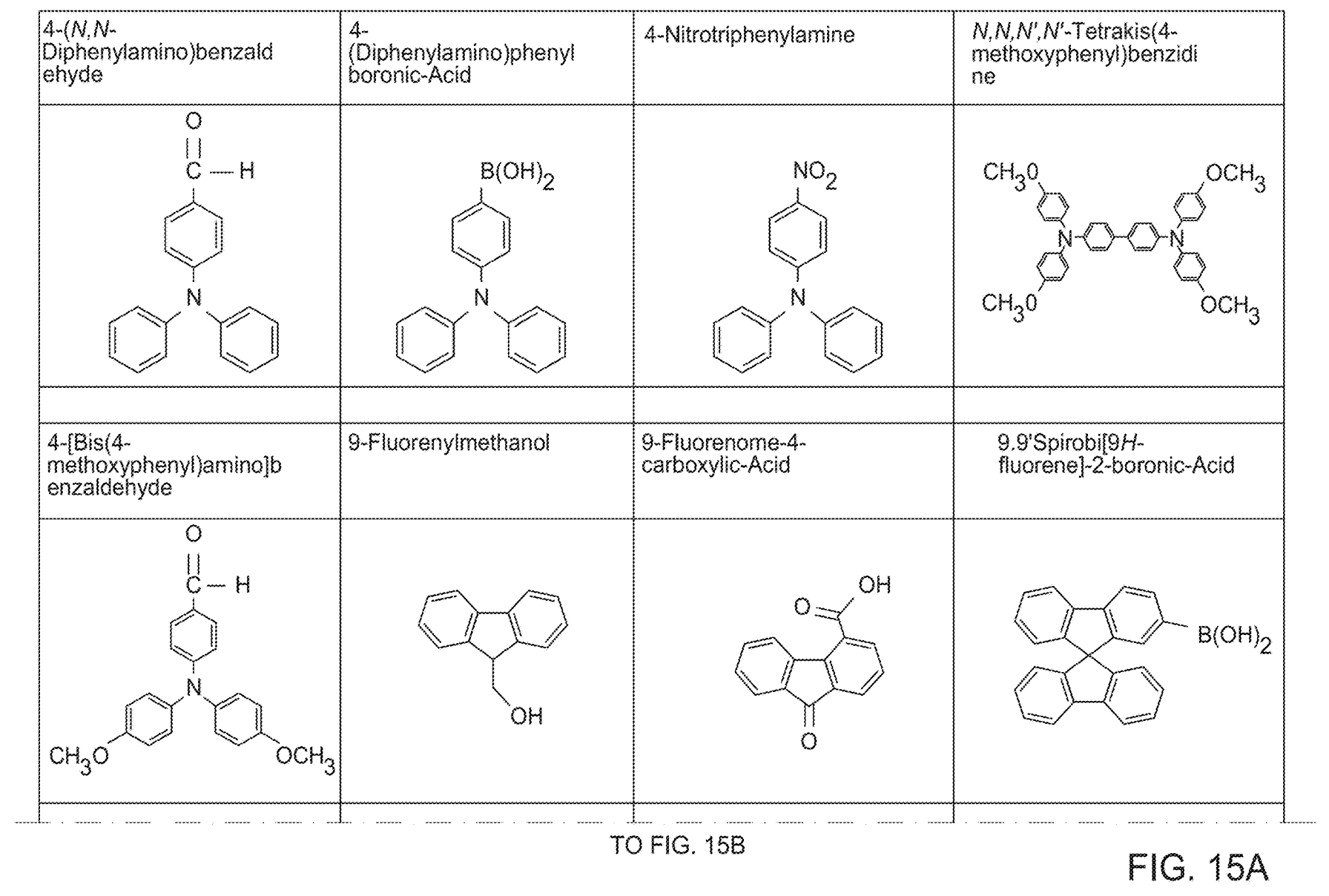

In some embodiments, the adhesion layer structure may also be practiced in NIP structures, for example by using analogs to common hole carrier-selective materials with cores such as fluorene, carbazole, or triarylamine (FIGS. 15A-15B), which as conjugated cores fall under the second category of molecules. FIGS. 15A-15B includes examples of hole carrier-selective material analogs with fluorene, carbazole, or triarylamine cores which have adhesive moi-eties which may meet the second class criteria. In some embodiments, a hole carrier-selective material can include one or more molecules such as: 4-(N,N-diphenylamino) benzaldehyde; 4-(diphenylamino)phenylboronic acid; 4-ni-trotriphenylamine; N,N,N',N'-tetrakis(4-methoxyphenyl) benzidine; 4-[bis(4-methoxyphenyl)amino]benzaldehyde; 9-fluorenylmethanol; 9-fluorenone-4-carboxylic acid; 9,9'-spirobi[9H-fluorene]-2-boronic acid; 9,9'-spirobi[9H-fluo-rene]-2-boronic acid; 2-hydroxy-9-fluorenone; 1-fluorenec-arboxylic acid; (9,9-dimethyl-9H-fluorene-2,7-diyl)dibo-ronic acid; 9,9-bis(4-hydroxyphenyl)fluorene; 3,6-di-aminocarbazole; 2-methoxycarbazole; 4-hydroxycarbazole; salts thereof or any combination thereof.

Embodiments of the disclosure provide the use of organic molecules in combination with or in replacement of organic molecules commonly used in metal-halide perovskite solar cells and modules which improve the mechanical adhesion between the organic layer(s) and oxide or metal layers, in particular between organic carrier selective layers and inorganic electrode layers. It is believed that the strategies provided herein can be used with no to mild effect on the performance of perovskite solar cells while decreasing the observation of scalloping delamination failure modes during laser scribing. This innovation may be applicable to a broad range of perovskite solar cell and module architectures, to other application of metal-halide perovskites such as LEDs, and more broadly to other applications where poor adhesion between organic and inorganic materials results in delamination.

Embodiment of the disclosure can include an electronic device comprising a first electrode, a second electrode, a first layer disposed between the first electrode and the second electrode, the first layer comprising a metal-halide perovskite material, and an adhesive layer disposed between the first layer and the second electrode, wherein the adhesive layer comprises an organic material. The electronic device may further include a second layer comprising a carrier-selective material is disposed on the first layer. The second layer may further include a material that includes one or more types of fullerenes. In one configuration, the adhesive layer is disposed on the second layer, and between the second layer and the second electrode. The electronic device may further include a third layer comprising a buffer material, wherein the third layer is disposed on the second layer. In another configuration, the electronic device may include a third layer comprising a buffer material, wherein the adhesive layer is disposed on the third layer, and the third layer is disposed between the second layer and the adhesive layer. In some embodiments, the organic material includes at least one of the following properties: an electronic mobility of $1\times10^{-5}$ cm$^2$/V/s or greater, a bandgap of 2 eV or greater, and a conduction band level of −5.5 eV or less with respect to vacuum level. The organic material includes molecules that have a core group and chelating termination moieties. In some embodiments, the adhesive layer includes at least one of the following properties: a thickness in a range from about 0.5 nm to about 200 nm, and an optical transmission of greater than 90% for photons having a wavelength in a range from about 700 nm to about 1,200 nm.

While the foregoing is directed to embodiments of the present disclosure, other and further embodiments of the disclosure may be devised without departing from the basic scope thereof, and the scope thereof is determined by the claims that follow.

What is claimed is:

1. An electronic device comprising:
a first electrode;
a second electrode;
a first layer disposed between the first electrode and the second electrode, the first layer comprising a metal-halide perovskite material; a second layer comprising a carrier-selective material disposed on the first layer; and
an adhesive layer comprising an organic material disposed between the second layer and the second electrode, wherein the adhesive layer comprises a multilayer stack comprising an adhesion-promoting layer and a third layer comprising a buffer material, wherein the adhesion-promoting layer is disposed on the second layer, and the organic material has an electronic mobility of $1\times10^{-5}$ cm$^2$/V/s or greater.

2. The electronic device of claim 1, wherein the second layer further comprises one or more fullerenes.

3. The electronic device of claim 1, wherein the adhesion-promoting layer comprises an organic material different than the buffer material.

4. The electronic device of claim 3, wherein the buffer material comprises a bathocuproine compound.

5. The electronic device of claim 3, wherein the buffer material comprises an inorganic material.

6. The electronic device of claim 1, wherein the organic material comprises a bathocuproine compound.

7. An electronic device comprising:
a first electrode;
a second electrode;
a first layer disposed between the first electrode and the second electrode, the first layer comprising a metal-halide perovskite material;
a second layer comprising a carrier-selective material disposed on the first layer, wherein the second layer comprises a bathocuproine compound; and
an adhesive layer comprising an organic material disposed between the second layer and the second electrode, wherein the adhesive layer comprises a multilayer stack comprising an adhesion-promoting layer and a third layer comprising a buffer material, wherein the adhesion-promoting layer is disposed on the second layer.

8. The electronic device of claim 1, wherein the second electrode is disposed on the adhesive layer.

9. The electronic device of claim 1, wherein the third layer is disposed on the adhesion-promoting layer, and the adhesion-promoting layer is disposed between the second layer and the third layer.

10. The electronic device of claim 1, wherein the organic material comprises a naphthalene compound, a phenanthroline compound, a perylene compound, a fluorene compound, a carbazole compound, a rylene compound, or any combination thereof.

11. The electronic device of claim 10, wherein the organic material comprises one or more functional groups selected from a diol, a hydroxyl, a hydroxymethyl, a carboxylate, an aldehyde, a carboxylic acid, a boronic acid, a methoxy, a tetrone, a carbonyl, an amino-N-oxide, a thiol, a thioester, a sulfide, a sulfoxide, a sulfilimine, a thioketone, a thioaldehyde, a S-oxide, a S,S-dioxide, a sulfene, a thiocarboxylic acid, a sulfonic acid, a sulfenic acid, a sulfonate ester, a sulfoxonium, any salt thereof, or any combination thereof.

12. The electronic device of claim 1, wherein the organic material comprises: 2,2'-bipyridine-6,6'-diol; 4,4'-bis(hydroxymethyl)-2,2'-bipyridine; dimethyl 2,2'-bipyridine-5,5'-dicarboxylate; dimethyl 2,2'-bipyridine-4,4'-dicarboxylate; 2,2'-bipyridine-5,5'-dicarboxylic acid; 2,2'-bipyridine-3,3'-dicarboxylic acid; 4,4'-dimethoxy-2,2'-bipyridyl; 4,7-dihydroxy-1,10-phenanthroline; 1,10-phenanthroline-5,6-dione; 1,4,5,8 naphthalenetetracarboxylic dianhydride; 2,7-dihexylbenzo[lmn][3,8]phenanthroline-1,3,6,8(2H,7H)-tetrone; 1,3,6,8(2H,7H)-tetraone,2,7-dicyclohexylbenzo[lmn][3,8] phenanthroline; 2,9-Bis[2-(4-fluorophenyl)ethyl]anthra[2,1, 9-def:6,5,10-d'e'f']diisoquinoline-1,3,8,10(2H,9H)tetrone; N,N'-di(4-pyridyl)-1,4,5,8-naphthalenetetracarboxdiimide; 1,8:4,5-naphthalenetetracarboxdiimide; 1,10-phenanthroline-5,6-dione; 5,8-dimethyldibenzo[b,j][1, 10]phenanthroline-6,7-diol; bathocuproinedisulfonic acid disodium salt hydrate; 4,7-dimethoxy-1,10-phenanthroline; salts thereof, or any combination thereof.

13. The electronic device of claim 1, wherein the organic material comprises: 4-(N,N-diphenylamino)benzaldehyde; 4-(diphenylamino)phenylboronic acid; 4-nitrotriphenylamine; N,N,N',N'-tetrakis(4-methoxyphenyl)benzidine; 4-[bis(4-methoxyphenyl)amino]benzaldehyde; 9-fluorenylmethanol; 9-fluorenone-4-carboxylic acid; 9,9'-spirobi[9H-fluorene]-2-boronic acid; 9,9'-spirobi[9H-fluorene]-2-boronic acid; 2-hydroxy-9-fluorenone; 1-fluorenecarboxylic acid; (9,9-dimethyl-9H-fluorene-2,7-diyl)diboronic acid; 9,9-bis(4-hydroxyphenyl)fluorene; 3,6-diaminocarbazole; 2-methoxycarbazole; 4-hydroxycarbazole; salts thereof, or any combination thereof.

14. The electronic device of claim 1, wherein the organic material has a bandgap of 2 eV or greater.

15. The electronic device of claim 1, wherein the organic material has a conduction band level of −5.5 eV or less with respect to vacuum level.

16. The electronic device of claim 1, wherein the adhesive layer has a thickness in a range from about 0.5 nm to about 200 nm.

17. An electronic device comprising:
a first electrode;
a second electrode;
a first layer disposed between the first electrode and the second electrode, the first layer comprising a metal-halide perovskite material;
a second layer comprising a carrier-selective material disposed on the first layer; and
an adhesive layer comprising an organic material disposed between the second layer and the second electrode, wherein the adhesive layer comprises a multilayer stack comprising an adhesion-promoting layer and a third layer comprising a buffer material, wherein the adhesion-promoting layer is disposed on the second layer, wherein the organic material has an optical transmission of greater than 90% for photons having a wavelength in a range from about 700 nm to about 1,200 nm.

18. The electronic device of claim 1, wherein the organic material is comprised of molecules with a core group and chelating termination moieties.

19. The electronic device of claim 1, wherein the organic material comprises a compound having a molecular weight in a range from about 100 g/mol to 2,000 g/mol.

20. The electronic device of claim 1, wherein the organic material of the adhesive layer comprises a compound having a molecular weight in a range from greater than 2,000 g/mol to 10,000 g/mol.

21. The electronic device of claim 1, wherein the organic material comprises a compound having a molecular weight in a range from greater than 10,000 g/mol to about 1,000,000 g/mol.

22. The electronic device of claim 1, wherein the organic material has a melting point or sublimation temperature of greater than 200° C. and less than 1,000° C.

23. The electronic device of claim 21, wherein the organic material comprises a compound with a molecular weight in a range from about 100 g/mol to about 10,000 g/mol.

24. The electronic device of claim 1, wherein the adhesive layer is an electron-selective layer.

25. The electronic device of claim 1, wherein the adhesive layer is a hole carrier-selective layer.

26. An electronic device comprising:
a first electrode;
a second electrode;
a first layer disposed between the first electrode and the second electrode, the first layer comprising a metal-halide perovskite material;
a carrier-selective layer disposed on the first layer; and
a second layer disposed between the carrier-selective layer and the second electrode, the second layer comprising a multilayer stack comprising an adhesion-promoting layer and a third layer comprising a buffer material;
wherein the adhesion-promoting layer comprises one or more conjugated or non-conjugated core material groups and one or more termination moieties,
wherein the core material groups are selected from bipyridine, naphthalene, perylene, phenanthroline, fluorene, triarylamine, carbazole, other rylene type material groups, other aromatic or nonaromatic conjugated groups, and linear or branched alkyl chains, and
wherein the termination moieties are selected from diols, hydroxyls, hydroxymethyls, carboxylates, aldehydes, carboxylic acid, boronic acid, methoxy, tetrone, carbonyl, or amino-N-oxide, thiols, thioesters, sulfides, sulfoxides, sulfilimines, thioketones, thioaldehydes, S-oxides, S,S-dioxides, sulfenes, thiocarboxylic acids, sulfonic acids, sulfenic acids, sulfonate esters, and sulfoxonium.

27. The electronic device of claim 22, wherein the second layer has
an electrical mobility of $1 \times 10^{-5}$ cm$^2$/V/s or greater; and
a lowest unoccupied molecular orbital of −3.8 eV or greater with respect to a vacuum level;
a bandgap of 2 eV or greater; and
a highest occupied molecular orbital of −5.5 eV or less with respect to the vacuum level.

28. The electronic device of claim 26, wherein the second layer comprises core groups selected from naphthalene, perylene, phenanthroline, fluorene, carbazole and other core groups within a rylene family of structures.

29. An electronic device comprising:
a first electrode;
a second electrode;
a first layer disposed between the first electrode and the second electrode, the first layer comprising a metal-halide perovskite material;
a second layer comprising a carrier-selective material disposed on the first layer; and
an adhesive layer comprising an organic material disposed between the second layer and the second electrode, wherein a critical fracture energy of a stack of the second layer, the adhesive layer, and the second electrode is greater than 1 J/m2.

* * * * *